(12) United States Patent  
Yeh

(10) Patent No.: US 10,009,045 B2  
(45) Date of Patent: Jun. 26, 2018

(54) DECODING METHOD, MEMORY CONTROLLING CIRCUIT UNIT AND MEMORY STORAGE DEVICE

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days. days.

(21) Appl. No.: 15/242,605

(22) Filed: Aug. 22, 2016

(65) Prior Publication Data

US 2018/0006669 A1 Jan. 4, 2018

(30) Foreign Application Priority Data

Jul. 1, 2016 (TW) .............................. 105120883 A

(51) Int. Cl.
| | |
|---|---|
| *H03M 13/35* | (2006.01) |
| *G06F 3/06* | (2006.01) |
| *G06F 11/10* | (2006.01) |
| *G11C 29/52* | (2006.01) |

(52) U.S. Cl.
CPC .......... *H03M 13/353* (2013.01); *G06F 3/064* (2013.01); *G06F 3/0619* (2013.01); *G06F 3/0653* (2013.01); *G06F 3/0679* (2013.01); *G06F 11/1068* (2013.01); *G11C 29/52* (2013.01)

(58) Field of Classification Search
CPC .. H03M 13/353; G06F 3/064; G06F 11/1068; G06F 3/0653; G06F 3/0619; G06F 3/0679; G11C 29/52
See application file for complete search history.

(56) References Cited

U.S. PATENT DOCUMENTS

| 8,418,015 B2 * | 4/2013 | Cao ................... H03M 13/1102 |
| | | 714/748 |
| 2009/0241008 A1 * | 9/2009 | Kim ................... G06F 11/1072 |
| | | 714/755 |
| 2011/0219284 A1 | 9/2011 | Uchikawa et al. |
| 2014/0068379 A1 | 3/2014 | Sakaue |
| 2016/0013814 A1 * | 1/2016 | Cideciyan ......... H03M 13/2909 |
| | | 714/755 |
| 2017/0237447 A1 * | 8/2017 | Cideciyan ......... H03M 13/2909 |
| | | 714/755 |

OTHER PUBLICATIONS

K. Haymaker and C. A. Kelley, "Structured Bit-Interleaved LDPC Codes for MLC Flash Memory," in IEEE Journal on Selected Areas in Communications, vol. 32, No. 5, pp. 870-879, May 2014.*
"Office Action of Taiwan Counterpart Application", dated Mar. 9, 2017, p. 1-p. 6.

* cited by examiner

*Primary Examiner* — Cynthia Britt
(74) *Attorney, Agent, or Firm* — JCIPRNET

(57) ABSTRACT

A decoding method, a memory controlling circuit unit and a memory storage device are provided. The decoding method includes: performing a first type decoding operation for a first frame including a first codeword to obtain a second codeword. The method also includes: recording error estimate information corresponding to the first frame according to an execution result of the first type decoding operation. The method further includes: updating the first codeword in the first frame to the second codeword if the error estimate information matches a first condition; and performing a second type decoding operation for a block code including the first frame.

24 Claims, 8 Drawing Sheets

$$\left. k \left\{ \begin{pmatrix} \overbrace{0 \quad 0 \quad 1 \quad 0 \quad 1 \quad 0 \quad 0 \quad 1 \quad 1}^{n} \\ 1 \quad 0 \quad 0 \quad 0 \quad 1 \quad 0 \quad 1 \quad 0 \quad 0 \\ 0 \quad 1 \quad 0 \quad 1 \quad 0 \quad 0 \quad 0 \quad 1 \quad 0 \\ 0 \quad 1 \quad 0 \quad 0 \quad 1 \quad 0 \quad 0 \quad 1 \quad 0 \\ 1 \quad 0 \quad 0 \quad 1 \quad 0 \quad 0 \quad 1 \quad 0 \quad 1 \\ 0 \quad 0 \quad 1 \quad 1 \quad 0 \quad 1 \quad 0 \quad 0 \quad 1 \\ 0 \quad 1 \quad 0 \quad 0 \quad 0 \quad 1 \quad 1 \quad 0 \quad 0 \\ 1 \quad 0 \quad 1 \quad 0 \quad 0 \quad 1 \quad 0 \quad 0 \quad 0 \end{pmatrix} \right. \right\} \leftarrow 800$$

FIG. 8

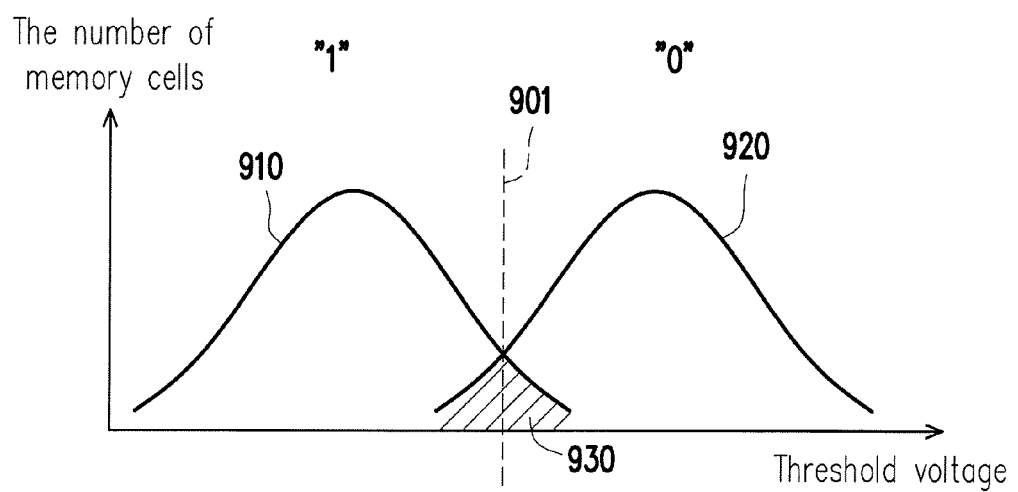

FIG. 9

$$\begin{Bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{Bmatrix} \begin{Bmatrix} V_0 \\ V_1 \\ V_2 \\ V_3 \\ V_4 \\ V_5 \\ V_6 \\ V_7 \\ V_8 \end{Bmatrix} = \begin{Bmatrix} S_0 \\ S_1 \\ S_2 \\ S_3 \\ S_4 \\ S_5 \\ S_6 \\ S_7 \end{Bmatrix}$$

| 1 | 0 | 0 | 1 | 1 | 0 | 0 | 0 |
|---|---|---|---|---|---|---|---|
| 1 | 0 | 1 | 0 | 0 | 1 | 0 | 0 |
| 0 | 0 | 1 | 1 | 0 | 1 | 1 | 1 |

DECODING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 105120883, filed on Jul. 1, 2016. The entirety of the above-mentioned patent application is hereby incorporated by reference herein and made a part of this specification.

BACKGROUND

Technical Field

The invention relates to a decoding method, and more particularly, to a decoding method for a rewritable non-volatile memory module, and a memory controlling circuit unit and a memory storage device using the same.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

Generally, data written in the rewritable non-volatile memory module is encoded according to an error correcting code. The data read from the rewritable non-volatile memory module may be decoded through corresponding decoding operation. Under some circumstances, a time required for the decoding may be longer if there are error bits in the read data and those error bits cannot be corrected. Further, in the traditional iteration decoding operation, the error bits in the data may either be successfully corrected in one decoding operation so the errors approach to convergence. Or, the errors approach to divergence because the decoding operation includes too many misjudgments. Therefore, in the circumstance where the errors of the data approach to divergence, the decoding operation continuously performed for correcting the data may lead to increasing number of the errors in the data which reduces its correction capability. Accordingly, it is one of the major subjects for person skilled in the art as how to increase a decoding speed or increase a decoding correction capability.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The present invention is directed to a decoding method, a memory controlling circuit unit and a memory storage device, which are capable of effectively improving the decoding correction capability.

In an exemplary embodiment, a decoding method for a rewritable non-volatile memory module is provided. The rewritable non-volatile memory module includes a plurality of memory cells. The decoding method includes: performing a first type decoding operation for a first frame including a first codeword to obtain a second codeword; recording error estimate information corresponding to the first frame according to an execution result of the first type decoding operation; updating the first codeword in the first frame to the second codeword if the error estimate information matches a first condition; and performing a second type decoding operation for a block code including the first frame.

In another exemplary embodiment, a memory controlling circuit unit for controlling a rewritable non-volatile memory module is provided. The rewritable non-volatile memory module includes a plurality of memory cells, and the memory controlling circuit unit includes a host interface, a memory interface, an error checking and correcting circuit and a memory management circuit. The host interface is configured to couple to a host system. The memory interface is configured to couple to a rewritable non-volatile memory module. The memory management circuit is coupled to the host interface, the memory interface and the error checking and correcting circuit. The error checking and correcting circuit is configured to perform a first type decoding operation for a first frame including a first codeword to obtain a second codeword. The memory management circuit is configured to record error estimate information corresponding to the first frame according to an execution result of the first type decoding operation. The memory management circuit is further configured to update the first codeword in the first frame to the second codeword if the error estimate information matches a first condition. In addition, the error checking and correcting circuit is further configured to perform a second type decoding operation for a block code including the first frame.

In another exemplary embodiment, a memory storage device including a connection interface unit, a rewritable non-volatile memory module and a memory controlling circuit unit is provided. The connection interface unit is configured to couple to a host system. The rewritable non-volatile memory module includes a plurality of memory cells. The memory controlling circuit unit is coupled to the connection interface unit and the rewritable non-volatile memory module. The memory controlling circuit unit is configured to perform a first type decoding operation for a first frame including a first codeword to obtain a second codeword, and record error estimate information corresponding to the first frame according to an execution result of the first type decoding operation. The memory controlling circuit unit is further configured to update the first codeword in the first frame to the second codeword if the error estimate information matches a first condition. In addition, the memory controlling circuit unit is further configured to perform a second type decoding operation for a block code including the first frame.

Based on the above, in an exemplary embodiment of the invention, by determining whether the errors in decoded data approach to convergence or divergence, whether to perform the succeeding decoding operation with said data may be determined. By doing so, the increasing number of the errors in the data caused by more of the misjudgments generated in the decoding operation later may be prevented. As a result, a decoding success rate of each decoding operation may be increased to improve a decoding efficiency.

To make the above features and advantages of the present disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 8 is a schematic diagram illustrating a parity check matrix according to an exemplary embodiment of the invention.

FIG. 9 is a schematic diagram illustrating threshold voltage distributions of the memory cells according to an exemplary embodiment of the invention.

FIG. 10 is a schematic diagram illustrating the parity check operation according to an exemplary embodiment of the invention.

FIG. 11 is a schematic diagram illustrating the decoding operation performed for one block code according to an exemplary embodiment of the invention.

DESCRIPTION OF THE EMBODIMENTS

Figure 1:
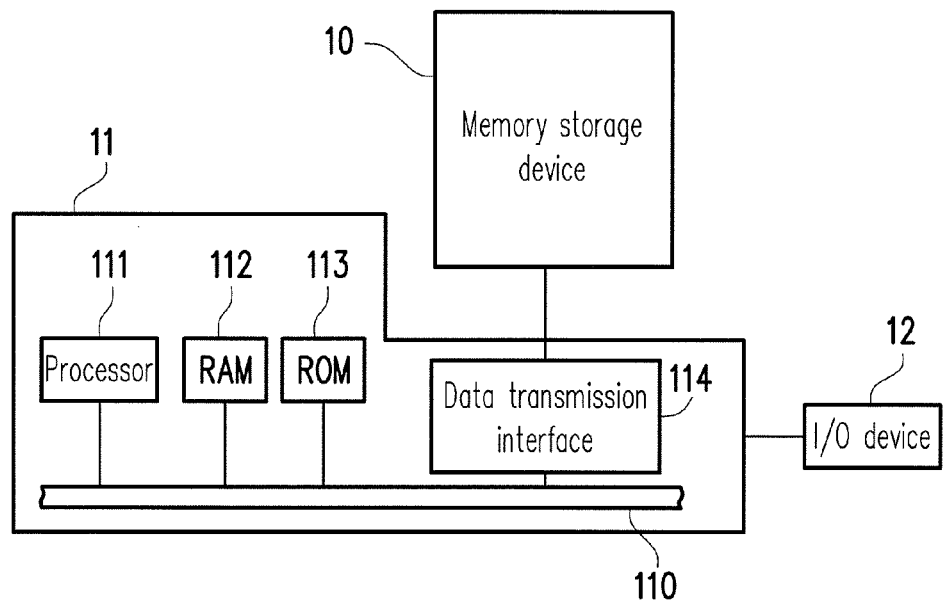
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so the host system may write data into the memory storage device or read data from the memory storage device.

Figure 2:
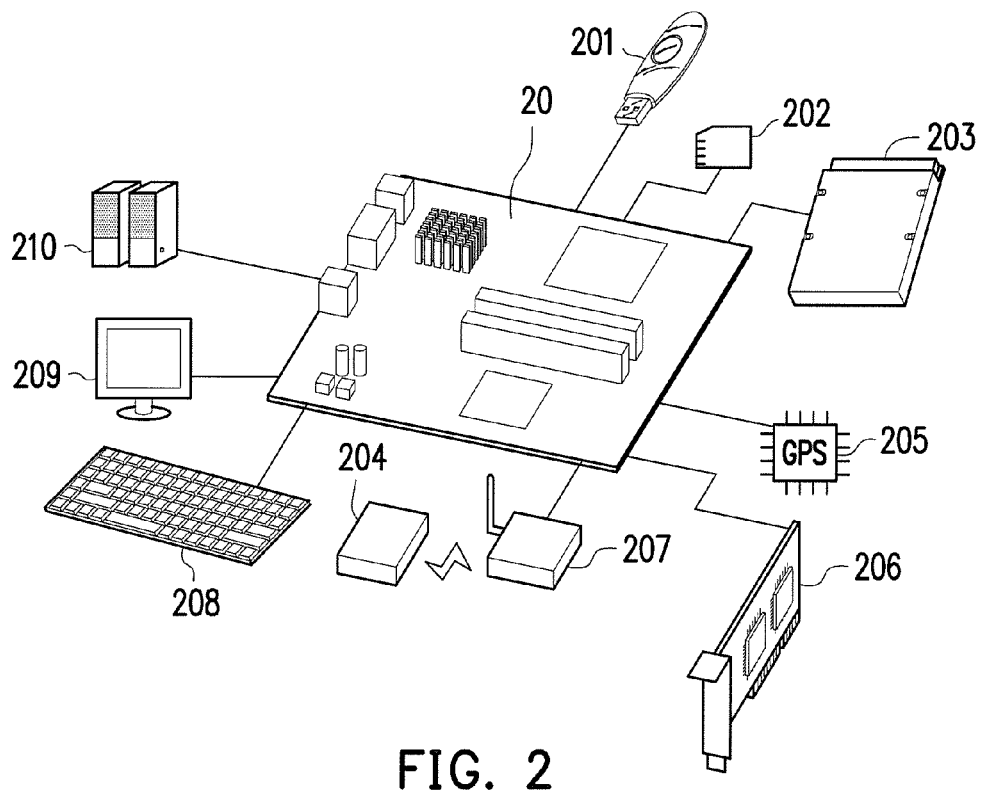
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices, such as a GPS (Global Positioning System) module 205, a network interface card 206, a wireless transmission device 207, a keyboard 208, a monitor 209 and/or a speaker 210 through the system bus 110. For example, in an exemplary embodiment, the main board 20 may access the wireless memory storage device 204 through the wireless transmission device 207.

Figure 3:
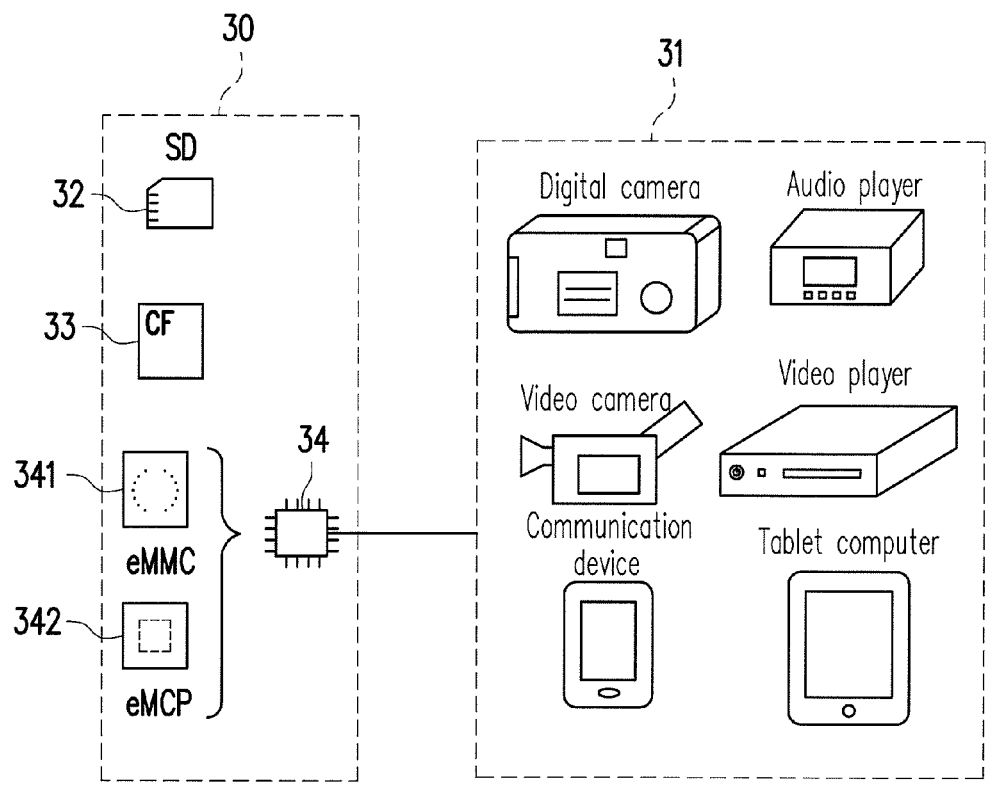
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
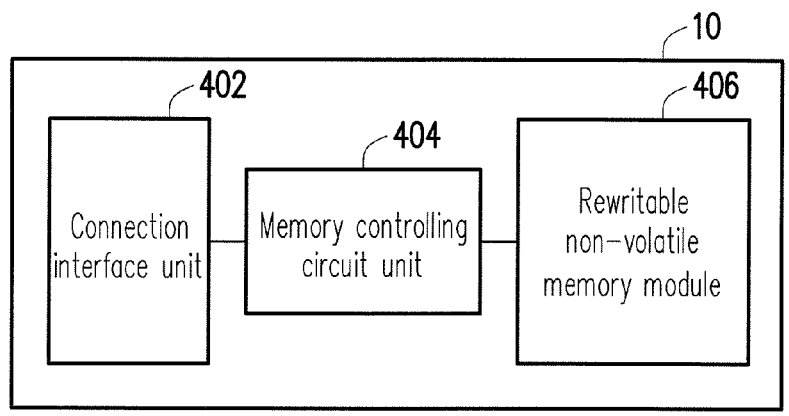
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory controlling circuit unit 404 may be packaged into one chip, or the connection interface unit 402 may be distributed outside of a chip including the memory controlling circuit unit 404.

The memory controlling circuit unit 404 is configured to execute a plurality of logic gates or control instructions which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

Figure 5:
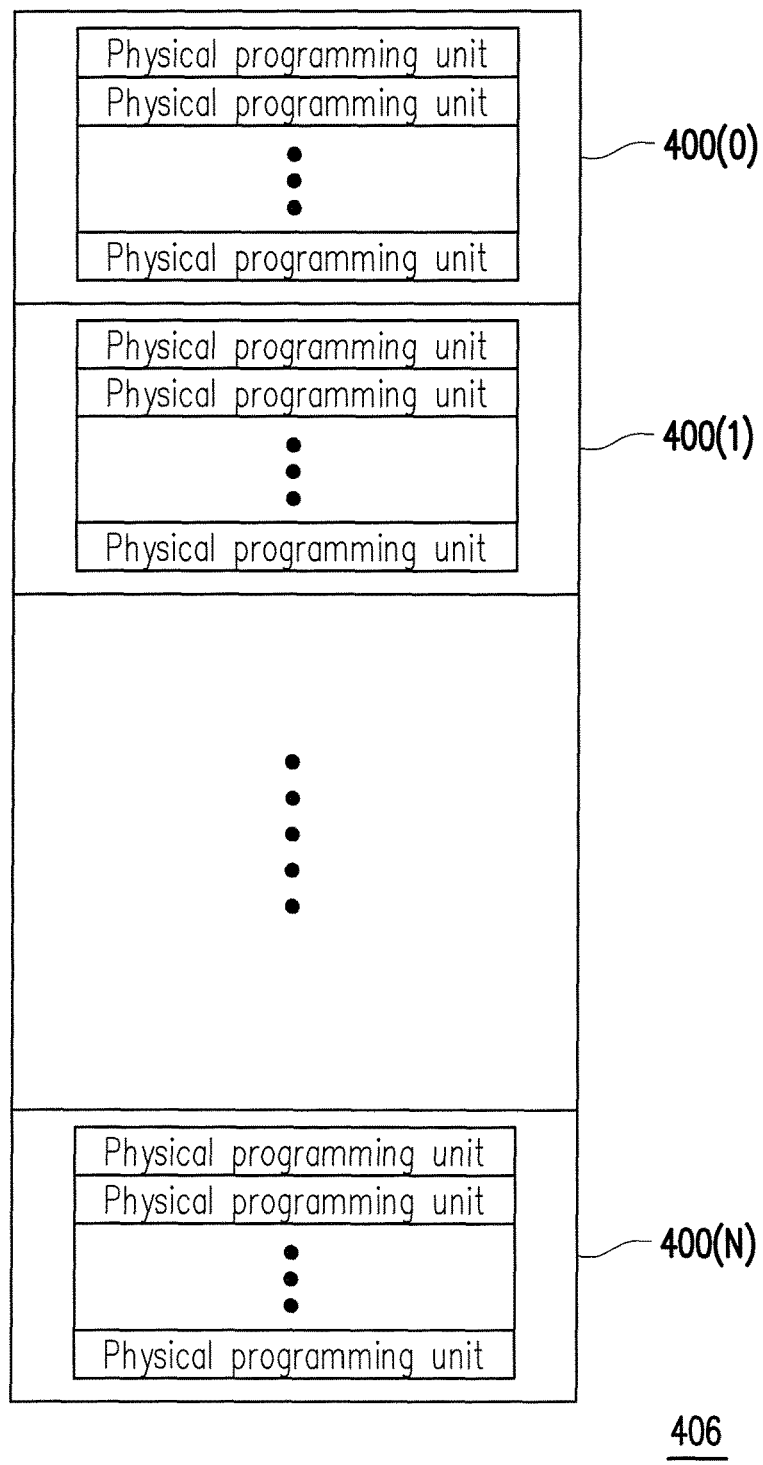
FIG. 5 is a schematic diagram illustrating an example for managing a rewritable non-volatile memory module according to an exemplary embodiment of the invention.

FIG. 5 is a schematic diagram illustrating an example for managing a rewritable non-volatile memory module according to an exemplary embodiment of the invention.

Referring to FIG. 5, the memory cells of the rewritable non-volatile memory module 406 constitute a plurality of physical programming units, and the physical programming units constitute a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is the lower physical programming unit, and the MSB of each memory cell is the upper physical programming unit. Generally, in the MLC NAND flash memory, a writing speed of the lower physical programming unit is higher than a writing speed of the upper physical programming unit, or a reliability of the lower physical programming unit is higher than a reliability of the upper physical programming unit. In the present exemplary embodiment, the physical programming unit is the minimum unit for programming. That is, the physical programming unit is the minimum unit for writing data. For example, the physical programming unit is a physical page or a physical sector. When the physical programming unit is the physical page, each physical programming unit usually includes a data bit area and a redundancy bit area. The data bit area has multiple physical sectors configured to store user data, and the redundancy bit area is configured to store system data (e.g., an error correcting code). In the present exemplary embodiment, each of the data bit areas contains 32 physical sectors, and a size of each physical sector is 612-byte (B). However, in other exemplary embodiments, the data bit area may also include 8, 16, or more or less physical sectors, and the invention is not intended to limit the size and number of the physical sectors. On the other hand, the physical erasing unit is the minimum unit for erasing. Namely, each physical erasing unit contains the least number of memory cells to be erased together. For instance, the physical erasing unit is a physical block.

Figure 6:
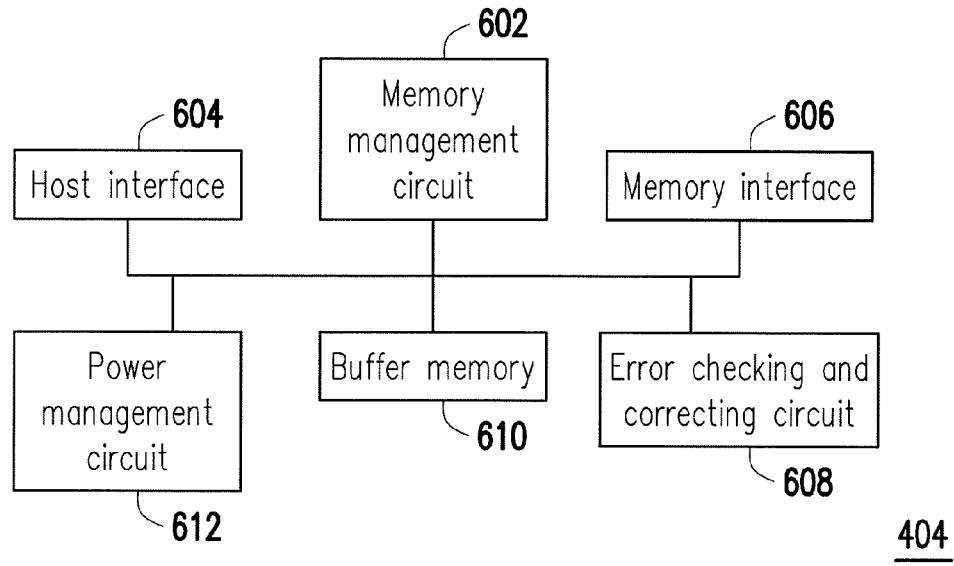
FIG. 6 is a schematic block diagram illustrating a memory controlling circuit unit according to an exemplary embodiment of the invention.

FIG. 6 is a schematic block diagram illustrating a memory controlling circuit unit according to an exemplary embodiment of the invention.

Referring to FIG. 6, the memory controlling circuit unit 404 includes a memory management circuit 602, a host interface 604, a memory interface 606 and an error checking and correcting circuit 608.

The memory management circuit 602 is configured to control overall operations of the memory controlling circuit unit 404. Specifically, the memory management circuit 602 has a plurality of control instructions and the control instructions are executed to perform various operations such as writing, reading and erasing data during operation of the memory storage device 10. Hereinafter, operations of the memory management circuit 602 are described as equivalent to describe operations of the memory controlling circuit unit 404.

In the present exemplary embodiment, the control instructions of the memory management circuit 602 are implemented in form of firmware. For instance, the memory management circuit 602 has a microprocessor unit (not illustrated) and a ROM (not illustrated), and the control instructions are burned into the ROM. When the memory storage device 10 operates, the control instructions are executed by the microprocessor to perform operations of writing, reading or erasing data.

In another exemplary embodiment, the control instructions of the memory management circuit 602 may also be stored as program codes in a specific area (for example, the system area in a memory exclusively used for storing system data) of the rewritable non-volatile memory module 406. In addition, the memory management circuit 602 has a microprocessor unit (not illustrated), the read only memory (not illustrated) and a random access memory (not illustrated). More particularly, the ROM has a boot code, which is executed by the microprocessor unit to load the control instructions stored in the rewritable non-volatile memory module 406 to the RAM of the memory management circuit 602 when the memory controlling circuit unit 404 is enabled. Then, the control instructions are executed by the microprocessor unit to perform operations, such as writing, reading or erasing data.

Further, in another exemplary embodiment, the control instructions of the memory management circuit 602 may also be implemented in a form of hardware. For example, the memory management circuit 602 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 602 may further issue command sequence of other types to the rewritable non-volatile memory module 406 for instructing to perform the corresponding operations.

The host interface 604 is coupled to the memory management circuit 602 and configured to receive and identify commands and data sent from the host system 11. In other words, the commands and data transmitted by the host system 11 are transmitted to the memory management circuit 602 through the host interface 604. In the present exemplary embodiment, the host interface 604 is compatible with the SATA standard. However, it should be understood that the invention is not limited thereto, and the host interface 604 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 606 is coupled to the memory management circuit 602 and configured to access the rewritable non-volatile memory module 406. In other words, data to be written to the rewritable non-volatile memory module 406 is converted into a format acceptable by the rewritable non-volatile memory module 406 through the memory interface 606. Specifically, if the memory management circuit 602 intends to access the rewritable non-volatile memory module 406, the memory interface 606 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection operation). These command sequences are generated by the memory management circuit 602 and transmitted to the rewritable non-volatile memory module 406 through the memory interface 606, for example. The command sequences may include one or more signals, or data transmitted in the bus. The signals or the data may include command codes and program codes. For example, information such as identification codes and memory addresses are included in the read command sequence.

The error checking and correcting circuit 608 is coupled to the memory management circuit 602 and configured to perform an error checking and correcting operation to ensure integrity of data. Specifically, when the memory management circuit 602 receives the write command from the host system 11, the error checking and correcting circuit 608 generates an ECC (error correcting code) and/or an EDC (error detecting code) for data corresponding to the write command, and the memory management circuit 602 writes data corresponding to the write command and the corresponding ECC and/or the EDC into the rewritable non-volatile memory module 406. Then, when the memory management circuit 602 reads the data from the rewritable non-volatile memory module 406, the corresponding ECC and/or the EDC are also read, and the error checking and correcting circuit 608 performs the error checking and correcting operation on the read data based on the ECC and/or the EDC.

In an exemplary embodiment, the memory controlling circuit unit 404 further includes a buffer memory 610 and a power management circuit 612.

The buffer memory 610 is coupled to the memory management circuit 602 and configured to temporarily store data and commands from the host system 11 or data from the rewritable non-volatile memory module 406. The power management unit 612 is coupled to the memory management circuit 602 and configured to control a power of the memory storage device 10.

Particularly, in the present exemplary embodiment, in the operation of storing the data into the rewritable non-volatile memory module 406 by the error checking and correcting circuit 608, the error checking and correcting circuit 608 encodes the data to be stored into the rewritable non-volatile memory module 406 and generates one coding unit. For example, the coding unit is constituted by the decoded data. The coding unit belongs to a block code. Thereafter, the memory management circuit 602 sends one write command sequence to the rewritable non-volatile memory module 406. The write command sequence is configured to instruct storing the coding unit into one specific area in the rewritable non-volatile memory module 406. For example, the specific area may be at least one physical programming unit and includes a plurality of memory cells. According to the write command sequence, the rewritable non-volatile memory module 406 stores the coding unit into the memory cells. Later, when the memory management circuit 602 instructs to read the data from the memory cells, the rewritable non-volatile memory module 406 reads the coding unit from the memory cells, and the error checking and correcting circuit 608 performs a corresponding decoding operation to decode the coding unit.

Figure 7:
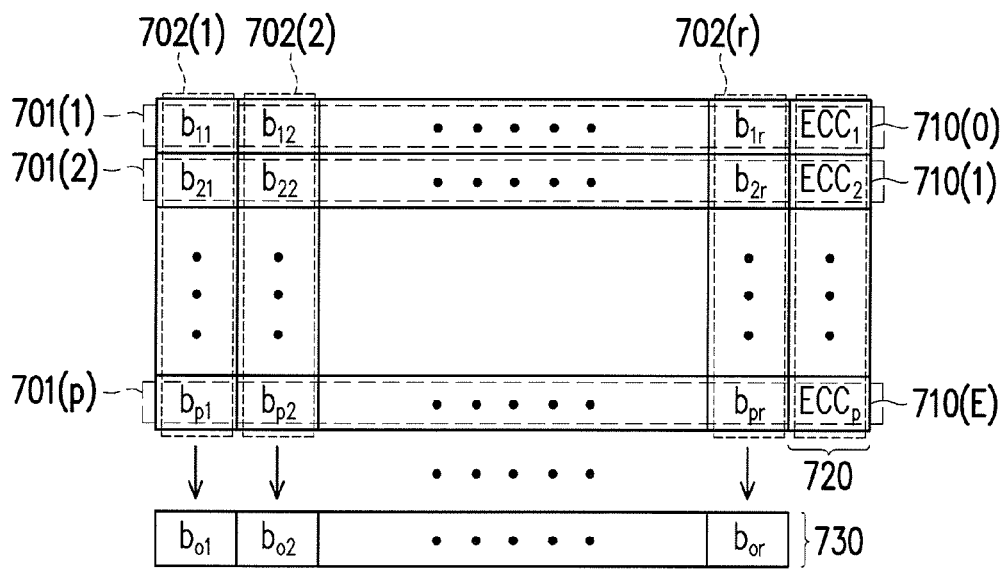
FIG. 7 is a schematic diagram of the block code according to an exemplary embodiment of the invention.

FIG. 7 is a schematic diagram of the block code according to an exemplary embodiment of the invention.

Referring to FIG. 7, a coding unit 700 belongs to the block code, and includes a plurality of frames 701(1) to 701(p) corresponding to a plurality of physical programming units 710(0) to 710(E). For example, at least a part of data stored in each one of the physical programming units 710(0) to 710(E) may be regarded as one frame. In the present exemplary embodiment, a basic unit of an encoding operation performed by the error checking and correcting circuit 608 is one frame. One frame includes a plurality of data bits. In this exemplary embodiment, one frame includes 256 bits. However, in another exemplary embodiment, one frame may also include more or less bits. For example, the error checking and correcting circuit 608 can perform a single-frame encoding for the data stored in the same physical programming unit and can also perform a multi-frame encoding for data stored in the multiple physical programming units.

In the single-frame encoding, the data in each of the frames 701(1) to 701(p) is encoded to generate corresponding encoded data 720. For example, bits $b_{11}$, $b_{12}$, ..., $b_{1r}$ of the frame 701(1) are encoded to be an error correcting code $ECC_1$ in the encoded data 720, and bits $b_{21}$, $b_{22}$, ..., $b_{2r}$ of the frame 701(2) are encoded to be an error correcting code $ECC_2$ in the encoded data 720. By analogy, bits $b_{p1}$, $b_{p2}$, ..., $b_{pr}$ of the frame 701(p) are encoded to be an error correcting code $ECC_p$ in the encoded data 720. Then, a horizontal decoding operation may be respectively performed for the data read from the physical units 710(0) to 710(E) according to the encoded data 720 to correct possible errors in the read data. For example, the error correcting code $ECC_1$ corresponding to one data in the frame 701(1) is used to decode all the bits $b_{11}$, $b_{12}$, ..., $b_{1r}$.

In the multi-frame encoding, the data in the frames 701(1) to 701(p) are encoded according to a position of each bit (or byte). Taking a corresponding encoded data 730 generated from the data stored in the frames 701(1) to 701(p) for example, the bits $b_{11}$, $b_{21}$, ..., $b_{p1}$ located at a position 702(1) are encoded to be a bit $b_{o1}$ in the encoded data 730, and the bits $b_{12}$, $b_{22}$, ..., $b_{p2}$ located at a position 702(2) are encoded to be a bit $b_{o2}$ in the encoded data 730. By analogy, bits $b_{1r}$, $b_{2r}$, ..., $b_{pr}$ at a position 702(r) are encoded to be a bit $b_{or}$ in the encoded data 730. Then, a vertical decoding operation may be performed for the data read from the physical units 710(0) to 710(E) according to the encoded data 730 to attempt correcting possible errors in the read data. For instance, each respective Nth bit of the encoded data corresponding to each of the frames 701(1) to 701(p) is used to decode each respective Nth bit of the data of each of the frames. For example, the $b_{o1}$ corresponding to each respective first bit of the frames 701(1) to 701(p) is configured to decode the bits $b_{11}$, $b_{21}$, ..., $b_{p1}$ located at the position 702(1) (i.e., each respective first bit of data of each of the frames 701(1) to 701(p)).

Herein, in another exemplary embodiment of FIG. 7, the data used for generating the encoded data 730 may also include redundancy bits corresponding to the data bits in the data stored in the physical programming units 710(0) to 710(E). Taking the data stored in the physical programming unit 710(0) for example, the redundancy bits therein are, for example, the error correcting code $ECC_1$ generated by performing the single-frame encoding for the data bits stored in the physical programming unit 710(0).

In the present exemplary embodiment, the single-frame encoding adopts a low density parity code (LDPC) algorithm (also known as a first type decoding operation), and the multi-frame encoding adopts a Reed-solomon code (RS code) algorithm (also known as a second type decoding operation). However, the invention is not limited thereto. For example, in another exemplary embodiment, each of the single-frame encoding and the multi-frame encoding may adopt at least one of encoding algorithms including a low density parity code, a BCH code, a convolutional code or a turbo code. Further, in another exemplary embodiment, other encoding algorithms not mentioned above may also be adopted, which are omitted herein. According to the adopted encoding algorithm, the error checking and correcting circuit 608 can encode the data to be protected, so as to generate the corresponding ECC and/or the EDC.

Specifically, in the single-frame encoding and decoding operations, the error checking and correcting circuit 608 adopts the low density parity check code for encoding and decoding. In the low density parity code, a valid codeword is defined by a parity check matrix. The parity check matrix is marked as a matrix H and a codeword is marked as CW hereinafter. According to an equation (1) below, if a result calculated by multiplying the parity check matrix H by the codeword CW is a zero vector, it indicates that the codeword CW is the valid codeword. Therein, an operator ⊗ represents a mod 2 matrix multiplication. In other words, a null space of the matrix H includes all the valid codewords. However, a content of the codeword CW is not particularly limited in the present invention. For instance, the codeword CW may also include the error correcting code or the error detecting code generated by using any algorithm.

$$H \otimes CW^T = 0 \qquad (1)$$

Therein, a dimension of the matrix H is k-by-n, and a dimension of the codeword CW is 1-by-n. k and n are positive integers. The codeword CW includes message bits and parity bits. That is, the codeword CW may be represented by [M P] in which a vector M is composed of the message bits and a vector P is composed of parity bits. A dimension of the vector M is 1-by-(n−k), and a dimension of the vector P is 1-by-k. Hereinafter, the message bits and the parity bits are collectively known as data bits. In other words, the codeword CW includes n bits, in which a length of the message bits is (n−k) bits, and a length of the parity bits is k bits, namely, a code rate of the codeword CW is (n−k)/n.

Generally, a generation matrix (hereinafter, marked as G) is used when encoding so Equation (2) below can be satisfied for the vector M being an arbitrary vector. Herein, a dimension of the generation matrix G is (n−k)-by-n.

$$M \otimes G = [M\ P] = CW \qquad (2)$$

Therein, the codeword CW generated by the equation (2) is the valid codeword. Therefore, Equation (2) may be substituted in Equation (1) to obtain Equation (3) below.

$$H \otimes G^T \otimes M^T = 0 \qquad (3)$$

Since the vector M may be arbitrary values, an equation (4) below may definitely be satisfied. In other words, after the parity check matrix H is decided, the corresponding generation matrix G may also be decided.

$$H \otimes G^T = 0 \qquad (4)$$

When one codeword CW is to be decoded, a parity check operation is first performed on the data bits in the codeword by, for example, multiplying the parity check matrix H by the codeword CW to generate one vector (hereinafter, marked as S, as shown in Equation (5) below). If the vector S is the zero vector, the codeword CW may be directly outputted. If the vector S is not the zero vector, it indicates that the codeword CW is not the valid codeword.

$$H \otimes CW^T = S \qquad (5)$$

A dimension of the vector S is k-by-1, in which each element is also known as a syndrome. If the codeword CW is not the valid codeword, the error checking and correcting circuit 608 may execute a decoding operation to attempt correcting error bits in the codeword CW.

FIG. 8 is a schematic diagram illustrating a parity check matrix according to an exemplary embodiment of the invention.

Referring to FIG. 8, a parity check matrix 800 has a dimension being k-by-n. For example, k is 8 and n is 9. However, the invention is not intended to limit values of the positive integers k and n. Each row in the parity check matrix 800 also represents a constraint. Take a first row of the parity check matrix 800 for example, when one specific codeword is the valid codeword, the bit "0" may be obtained after performing a modulo-2 addition on third, fifth, eighth and ninth bits in the codeword. Person of ordinary skill in the art should be able to understand how to use the parity check matrix 800 for encoding, and thus related description is omitted hereinafter. In addition, the parity check matrix 800 is merely a sample matrix instead of limitation to the invention.

When the memory management circuit 602 intends to store a plurality of bits into the rewritable non-volatile memory module 406, the error checking and correcting circuit 608 generates corresponding k parity bits for each of (n−k) bits to be stored (i.e., the message bits). Next, the memory management circuit 602 writes the n bits (i.e., the data bits) as one codeword into the rewritable non-volatile memory module 406.

FIG. 9 is a schematic diagram illustrating threshold voltage distributions of the memory cells according to an exemplary embodiment of the invention.

Referring to FIG. 9, a horizontal axis represents the threshold voltage of the memory, and a vertical axis represents a number of the memory cells. For example, FIG. 9 illustrates the threshold voltage of each memory cell in one specific physical programming unit. It is assumed that a state 910 corresponds to the bit "1", and a state 920 corresponds to the bit "0". When the threshold voltage of one specific memory cell belongs to the state 910, the bit stored by the specific memory cell is the bit "1"; otherwise, if the threshold voltage of one specific memory cell belongs to the state 920, the bit stored by the specific memory cell is the bit "0". It is worth mentioning that, in the present exemplary embodiment, one state of the threshold voltage distribution corresponds to one bit value, and the threshold voltage distribution of the memory cell includes two possible states. However, in other exemplary embodiments, each state in the threshold voltage distribution may also correspond to a plurality of bit values and the threshold voltage distribution of the memory cell may also include four, eight or any number of possible states. In addition, the bit represented by each state is not particularly limited by the invention. For example, in another exemplary embodiment of FIG. 9, it is also possible that the state 910 corresponds to the bit "0" while the state 920 corresponds to the bit "1".

In the present exemplary embodiment, when it is intended to read the data from the rewritable non-volatile memory module 406, the memory management circuit 602 sends a read command sequence (also known as a first read command sequence) to the rewritable non-volatile memory module 406. The first read command sequence is configured to instruct the rewritable non-volatile memory module 406 to read a plurality of memory cells in one physical programming unit to obtain data stored in the memory cells. For example, according to the first read command sequence, the rewritable non-volatile memory module 406 may read the memory cells by using a read voltage 901 in FIG. 9. If the threshold voltage of one of the read memory cells is less than the read voltage 901, such memory cell is turned on so the memory management circuit 602 reads the bit "1". Conversely, if the threshold voltage of one of the read memory cells is greater than the read voltage 901, such memory cell is not turned on so the memory management circuit 602 reads the bit "0". Further, in another exemplary embodiment, one read operation may also refer to reading the memory cells in a plurality of the physical programming units or a part of memory cells in one physical programming unit, and the invention is not limited thereto.

In the present exemplary embodiment, an overlap region 930 is included between the state 910 and the state 920. An area of the overlap region 930 is positively correlated to a total number of the memory cells having the threshold voltage that falls within the overlap region 930 among the read memory cells. The overlap region 930 indicates that, some of the memory cells among the memory cells should have stored the bit "1" (which belongs to the state 910) and yet have the threshold voltage greater than the read voltage 901; or some of the memory cells among the memory cells should have stores the bit "0" (which belongs to the state 920) and yet have the threshold voltage less than the read voltage 901. In other words, some of the bits include errors in the data read by applying the read voltage 901.

In the present exemplary embodiment, the error checking and correcting circuit 608 is to perform an iteration decoding operation. One iteration decoding operation is configured to decode one data from the rewritable non-volatile memory module 406. For example, one decoding unit in the data is one codeword. In one iteration decoding operation, the parity check operation for checking integrity of the data and the decoding operation for correcting errors in the data are performed repeatedly until the decoding succeeds or an iteration count reaches a predetermined count. If the iteration count reaches the predetermined count (which means that the decoding fails), the error checking and correcting circuit 608 stops decoding. In addition, if the parity checking operation determines that one specific data does not include errors, the error checking and correcting circuit 608 outputs such data.

FIG. 10 is a schematic diagram illustrating the parity check operation according to an exemplary embodiment of the invention.

Referring to FIG. 10, it is assumed that the data read from the memory cells includes a codeword 1001. In the parity check operation, a parity check matrix 800 is multiplied by the codeword 1001 to obtain a vector 1002 (i.e., the vector S) according to Equation (5). Herein, each bit in the codeword 1001 corresponds to at least one element (i.e., the syndrome) in the vector 1002. For instance, a bit $V_0$ in the codeword 1001 (corresponding to a first column of the parity check matrix 800) corresponds to syndromes $S_1$, $S_4$ and $S_7$; a bit $V_1$ (corresponding to a second column of the parity check matrix 800) corresponds to syndromes $S_2$, $S_3$ and $S_6$; and the rest may be deduced by analogy. If the bit $V_0$ is the error bit, at least one of the syndromes $S_1$, $S_4$ and $S_7$ may be "1". If the bit $V_1$ is the error bit, at least one of the syndromes $S_2$, $S_3$ and $S_6$ may be "1", and the rest may be deduced by analogy.

In other words, if the syndromes $S_0$ to $S_7$ are all "0", it means that codeword 1001 may not include the error bit, and thus the error checking and correcting circuit 608 may directly output the codeword 1001. However, if the codeword 1001 includes at least one error bit, at least one of the syndromes $S_0$ to $S_7$ may be "1", and thus the error checking and correcting circuit 608 performs the decoding operation for correcting the errors in the codeword for the codeword 1001.

In the present exemplary embodiment, the error checking and correcting circuit 608 supports one or more decoding algorithms. For example, the error checking and correcting circuit 608 may support at least one of the decoding algorithms including a Bit-Flipping algorithm, a Min-Sum algorithm, a Sum-Product algorithm, but the types of usable decoding algorithm are not limited by the above. After determining that the data includes the errors, the error checking and correcting circuit 608 performs one decoding operation based on one decoding algorithm. In addition, two consecutively performed decoding operations may be performed based on identical or different decoding algorithms.

Figure 12A:
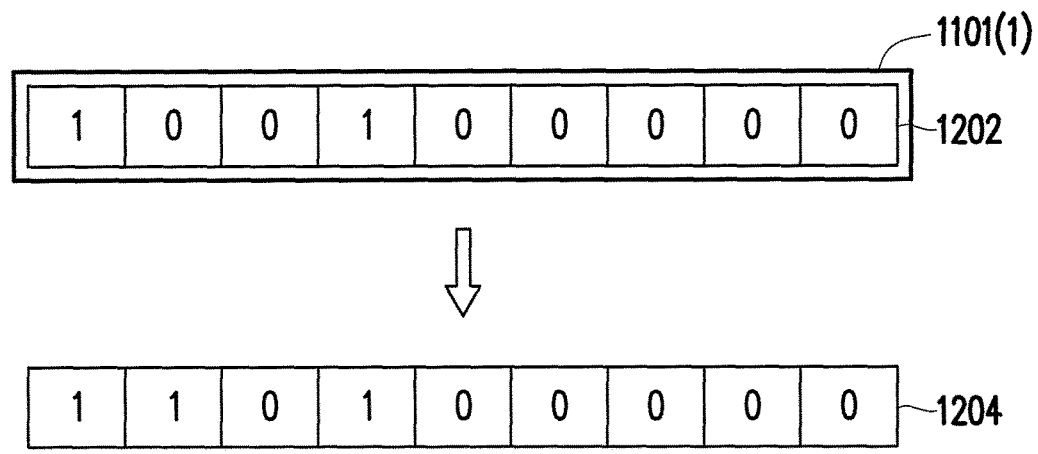
FIG. 12A to FIG. 12B are schematic diagrams illustrating the decoding operation performed for one frame according to an exemplary embodiment of the invention.
Figure 12B:
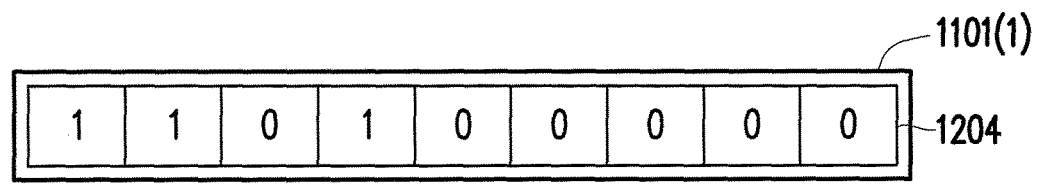

FIG. 11 is a schematic diagram illustrating the decoding operation performed for one block code according to an exemplary embodiment of the invention. FIG. 12A to FIG. 12B are schematic diagrams illustrating the decoding operation performed for one frame according to an exemplary embodiment of the invention.

Referring to FIG. 11, after the memory management circuit 602 sends the first read command sequence to the rewritable non-volatile memory module 406 and reads the data from the memory cells of the rewritable non-volatile memory module 406, the memory management circuit 602 obtains a plurality of frames 1101(1) to 1101(3) corresponding to the data, and the error checking and correcting circuit 608 decodes a block code 1100 composed of the frames 1101(1) to 1101(3). Specifically, one iteration decoding operation corresponding to the block code 1100 includes respectively performing the first type decoding operation for each of the frames in the block code 1100, and performing the second type decoding operation for each of the frames. Particularly, in the exemplary embodiments of the invention, after respectively performing the first type decoding operation for each of the frames in the block code 1100 and performing the decoding operation for correcting the errors therein to generate another codeword, the memory management circuit 602 first determines whether the errors in a decoding result (i.e., the another codeword obtained after decoding) approach to divergence or convergence, so as to determine whether to perform the succeeding second type decoding operation with the current codeword. Hereafter, with reference to FIGS. 12A and 12B, one frame in the block code 1100 is used as an example to describe the operation of determining whether the errors in the corresponding codeword approach to convergence or divergence.

Referring to FIG. 12A first, the error checking and correcting circuit 608 uses a frame 1101(1) (also known as a first frame 1101(1) in the block code 1110 as a unit for decoding a codeword 1202 (also known as a first codeword 1202). It should be noted that, the first codeword 1202 may be original data (i.e., aforesaid first codeword 1102) read from the memory cells, or data underwent the iteration decoding operation corresponding to the block code 1100 at least once, which are not particularly limited by the present invention. Specifically, the error checking and correcting circuit 608 determines whether the first codeword 1202 includes one or more errors. For example, in the present exemplary embodiment, the error checking and correcting circuit 608 performs the first type decoding operation (i.e., the parity check operation) for the first codeword 1202 to obtain a plurality of syndromes (also known as first syndromes), and these first syndromes can compose aforesaid vector S. In an exemplary embodiment, the vector S is also known as a syndrome vector. The error checking and correcting circuit 608 determines whether the first codeword 1202 includes one or more errors according to a plurality of first syndromes in the syndrome vector S. The operation of determining whether the decoding result includes one or more errors according the syndromes has been described in aforementioned example of FIG. 10, which is not repeated hereinafter.

Specifically, after the decoding operation for correcting errors is performed for one codeword, it is possible that the error bits in such codeword are successfully corrected by this decoding operation so the errors approach to convergence. Or, the errors approach to divergence because the decoding operation includes too many misjudgments. In the circumstance where the errors approach to convergence, as the errors in the codeword are gradually corrected, a total number of the error bits in the codeword is gradually decreased and a decoding success rate is increased for the codeword also. Conversely, in the circumstance where the errors approach to divergence, if the decoding operation is continuously performed for the codeword, the errors in the codeword may continue to increase due to the misjudgments and worth yet, the error bit occurrence rate of the codeword may gradually increase and lead to a decoding failure. Therefore, in the present exemplary embodiment, after the error checking and correcting circuit 608 performs the decoding operation (e.g., at least one of decoding algorithms including the Bit-Flipping algorithm, the Min-Sum algorithm, the Sum-Product algorithm) for correcting the errors in the first codeword 1202 to obtain another codeword 1204

(also known as a second codeword 1204), the memory management circuit 602 further determines whether the errors in the second codeword 1204 approach to divergence or convergence according an execution result of the first type decoding operation (i.e., the parity check operation) performed for the first codeword 1202. For example, in the present exemplary embodiment, the memory management circuit 602 calculates a sum of the first syndromes to obtain error estimate information, and determines whether the errors in the codeword approach to divergence or convergence.

Referring back to FIG. 10, in the operation of calculating a syndrome sum, the memory management circuit 602 accumulates the syndromes $S_0$ to $S_7$ in the syndrome vector 1002 to obtain the syndrome sum. Herein, the accumulation refers to the normal addition in stead of the modulo 2 addition. The syndrome sum may be used to represent how many "1" (or how many "0") are included in the syndromes $S_0$ to $S_7$. For example, if three "1" are included in the syndromes $S_0$ to $S_7$, the syndrome sum is "3". For example, if seven "1" are included in the syndromes $S_0$ to $S_7$, the syndrome sum is "7". Generally, if the codeword 1001 includes more error bits, the more "1" will be included in the syndromes $S_0$ to $S_7$, so the syndrome sum is larger. If the codeword 1001 includes fewer error bits, the fewer "1" will be included in the syndromes $S_0$ to $S_7$ so the syndrome sum is smaller. Therefore, the obtained error estimate information is positively correlated to the syndrome sum.

In the present exemplary embodiment, because the error estimate information corresponding to one codeword is positively correlated to the syndrome sum, the error estimate information may be used to indicate a size of a total number of error bits in the codeword. Accordingly, in the circumstance where the first type decoding operation is performed for the first codeword 1202 and determines that it has at least one error, the memory management circuit 602 determines whether the decoding result is divergence or convergence according to the error estimate information. Here, the memory management circuit 602 determines whether the error estimate information matches a condition (also known as a first condition). Specifically, the first condition is a value of the error estimate information being less than or equal to an error bit quantity threshold. Therefore, when the memory management circuit 602 determines that the error estimate information does not match the first condition, it is equivalent to the total number of the error bits of the decoding result being greater than the error bit quantity threshold. Accordingly, the memory management circuit 602 determines that the decoding result is divergence, and does not output the decoding result. That is, the succeeding second type decoding operation is performed without using the second codeword 1204.

Conversely, when the memory management circuit 602 determines that the error estimate information matches the first condition, it is equivalent to the total number of the error bits of the decoding result being less than or equal to the error bit quantity threshold. Accordingly, the memory management circuit 602 determines that the decoding result is convergence and outputs the second codeword 1204. Also, the succeeding second type decoding operation is performed using the second codeword 1204. For example, the memory management circuit 602 updates the first codeword 1202 in the first frame 1101(1) to the second codeword 1204 (as shown in FIG. 12B). Next, the error checking and correcting circuit 608 performs the second type decoding operation for the frame 1101(1) to the frame 1101(3) in the bock code 1100.

In the present exemplary embodiment, the error checking and correcting circuit 608 performs the single-frame encoding for each data belonging to the same frame, and performs the multi-frame encoding for the data stored in the multiple frames. Hence, during the decoding operation performed by the error checking and correcting circuit 608, the error checking and correcting circuit 608 first performs the parity check operation (i.e., the first type decoding operation) for checking integrity of the data and the decoding operation for correcting the errors in the data for the codeword stored in each frame in the block code, and then performs the second type decoding operation for the multiple frames in the block code. Particularly, in the present exemplary embodiment, after the error checking and correcting circuit 608 performs the first type decoding operation for the codeword stored by one frame and performs the decoding operation for correcting the errors therein to generate another codeword, the memory management circuit 602 further determines whether the decoding result (i.e., the codeword obtained after decoding) is divergence or convergence, so as to determine whether to perform the succeeding second type decoding operation with said codeword. By doing so, the increasing number of the errors in the codeword caused by more of the misjudgments generated in the decoding operation later may be prevented.

Here, taking the decoding operation in FIG. 12A and FIG. 12B for example, when determining that the errors in the first codeword 1202 approach to convergence, the memory management circuit 602 updates the first codeword 1202 in the first frame 1101(1) to the second codeword 1204. Similarly, the memory management circuit 602 performs the operation of determining whether the errors in the decoding result approach to divergence or convergence for the rest of the frames (i.e., the frame 1101(2) and the frame 1101(3)) in the block code 1100 including the first frame 1101(1). As such, it can be ensured that the errors in the codeword corresponding to each frame in the block code do not approach to divergence, so as to increase the decoding success rate and the overall decoding speed. Then, the error checking and correcting circuit 608 performs the second type decoding operation for the frame 1101(1) to the frame 1101(3) in the block code 1100. Under the premise of making the errors in the codeword corresponding to each frame in the block code approach to convergence, a decoding success rate of the second type decoding operation performed for all the frames in the block code by the error checking and correcting circuit 608 may also be increased.

In another exemplary embodiment, after the memory management circuit 602 respectively performs the operation of determining whether the errors in the codeword approach to divergence or convergence for the frame 1101(1) to the frame 1101(3) according to the execution results of the first type decoding operation for all the frames (i.e., the frame 1101(1) to the frame 1101(3)) in the block code 1100, the memory management circuit 602 further determines whether at least one frame having the error estimate information of a codeword thereof matching the first condition exists among the frame 1101(1) to the frame 1101(3), and simultaneously performs the second type decoding operation for the frame 1101(1) to the frame 1101(3) only when such condition is met, so as to complete one iteration decoding operation corresponding to the block code 1100. Otherwise, the memory management circuit 602 stops the iteration decoding operation corresponding to the block code 1100. Specifically, if the at least one frame having the error estimate information of the codeword thereof matching the first condition does not exist among the frame 1101(1) to 1101(3), it means that the errors of the codewords in all the frames 1101(1) to 1101(3) in the block code 1100 approach to divergence. Accordingly, the memory management circuit 602 does not perform the decoding operation for correcting the errors in the codeword for the frame 1101(1) to the frame 1101(3). That is, the memory management circuit 602 does not update the codewords in the frames 1101(1) to 1101(3). Because the codeword in each of the frames 1101(1) to 1101(3) in the block code 1100 maintains as the result obtained from the last time when the iteration decoding operation corresponding to the block code 1100 is performed, the execution result obtained from the next time when the iteration decoding operation corresponding to the block code 1100 is performed will still be the same to the result of the last time in such condition. That is, the execution result of the first type decoding operation performed for the frame 1101(1) to the frame 1101(3) in the block code 1100 by the memory management circuit 602 will still be the same result, i.e., the errors in the codewords in all the frames 1101(1) to 1101(3) approach to divergence. In other words, in this case, the codewords in all the frames 1101(1) to 1101(3) in the block code 1100 will no longer be changed regardless of how many times the iteration decoding operation corresponding to the block code 1100 is performed thereto. Accordingly, the memory management circuit 602 determines that the decoding operation failed, and stops the iteration decoding operation corresponding to the block code 1100, so as to save a computing resource of the memory management circuit 602.

Figure 13:
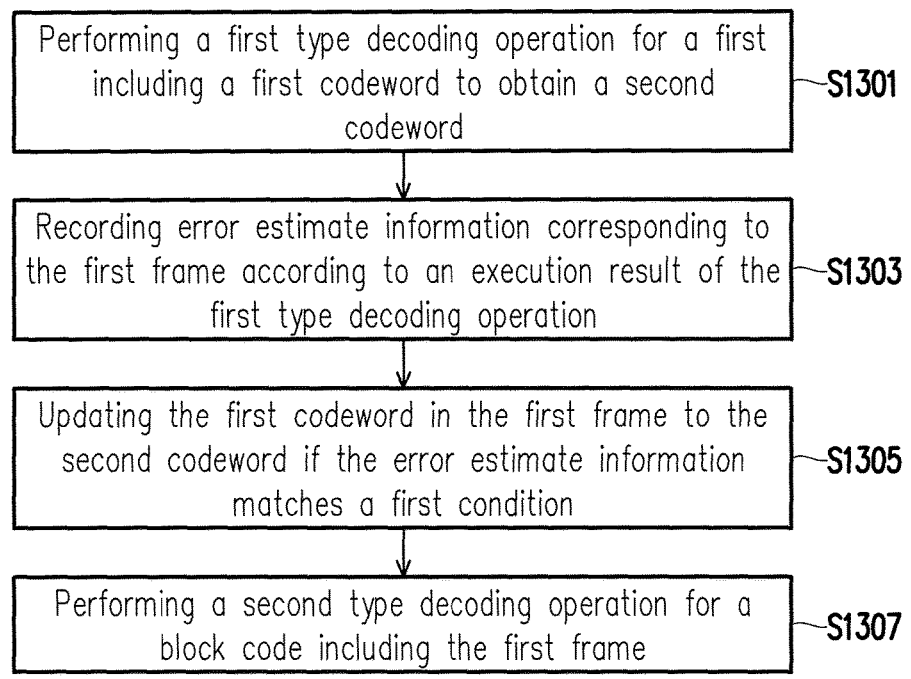
FIG. 13 is a flowchart illustrating a decoding method according to an exemplary embodiment of the disclosure.

FIG. 13 is a flowchart illustrating a decoding method according to an exemplary embodiment of the disclosure.

Referring to FIG. 13, in step S1301, the error checking and correcting circuit 608 performs a first type decoding operation for a first frame including a first codeword to obtain a second codeword.

In step S1303, the memory management circuit 602 records error estimate information corresponding to the first frame according to an execution result of the first type decoding operation.

Next, in step S1305, the memory management circuit 602 updates the first codeword in the first frame to the second codeword if the error estimate information matches a first condition.

Then, in step S1307, the error checking and correcting circuit 608 performs a second-type decoding operation for a block code including the first frame.

Nevertheless, steps depicted in FIG. 13 are described in detail as above so that related description thereof is omitted hereinafter. It should be noted that, the steps depicted in FIG. 13 may be implemented as a plurality of program codes or circuits, which are not particularly limited in the invention. Moreover, the method disclosed in FIG. 13 may be implemented by reference with above exemplary embodiments, or may be implemented separately, which are not particularly limited in the invention.

In summary, according to the decoding method, the memory storage device and the memory controlling circuit unit proposed proposed in the exemplary embodiments of the invention, after the decoding operation for correcting errors is performed for the data with the errors, whether the errors in the data approach to divergence or convergence may be determined so as to determine whether to perform the succeeding decoding operation with said data. By doing so, the increasing number of the errors in the codeword caused by more of the misjudgments generated in the decoding operation later may be prevented. As a result, the decoding success rate and the decoding efficiency of the memory storage device may be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a rewritable non-volatile memory module, the rewritable non-volatile memory module comprising a plurality of memory cells, the decoding method comprising:
   performing a first type decoding operation for a first frame comprising a first codeword to obtain a second codeword;
   recording error estimate information corresponding to the first frame according to an execution result of the first type decoding operation;
   updating the first codeword in the first frame to the second codeword if the error estimate information matches a first condition and not updating the first codeword in the first frame to the second codeword if the error estimate information does not match the first condition; and
   performing a second type decoding operation for a block code comprising the first frame.

2. The decoding method of claim 1, further comprising:
   sending a first read command sequence, wherein the first read command sequence is configured to read data from the memory cells; and
   obtaining a plurality of frames corresponding to the data, wherein the frames comprise the first frame, and the first frame comprises the first codeword.

3. The decoding method of claim 2, wherein the block code comprises the frames corresponding to the data,
   wherein one iteration decoding operation corresponding to the block code comprises respectively performing the first type decoding operation for each of the frames, and performing the second type decoding operation for each of the frames.

4. The decoding method of claim 3, wherein before performing the second type decoding operation for the block code comprising the first frame, the decoding method comprises:
   determining whether at least one frame having the error estimate information of a codeword thereof matching the first condition exists among the frames;
   performing next iteration decoding operation corresponding to the block code after performing the second type decoding operation for the block code comprising the first frame if the at least one frame having the error estimate information of the codeword thereof matching the first condition exists among the frames; and
   stopping the iteration decoding operation corresponding to the block code if the at least one frame having the error estimate information of the codeword thereof matching the first condition does not exist among the frames.

5. The decoding method of claim 3, wherein the first type decoding operation comprises a low density parity code algorithm, and the second type decoding operation comprises a Reed-solomon code algorithm,
   wherein the first type decoding operation is to respectively perform a horizontal decoding for all bits of each of the frames, and the second type decoding operation is to simultaneously perform a vertical decoding for each respective Nth bit of each of the frames.

6. The decoding method of claim 1, wherein the step of recording the error estimate information corresponding to the first frame according to the execution result of the first type decoding operation comprises:
obtaining the error estimate information corresponding to the first codeword, wherein the error estimate information is configured to indicate a size of a total number of error bits of the first codeword.

7. The decoding method of claim 6, wherein the step of obtaining the error estimate information corresponding to the first codeword comprises:
performing a parity check operation for the first codeword to obtain a plurality of first syndromes, and recording a value of the error estimate info' nation as a sum of the first syndromes.

8. The decoding method of claim 7, wherein the first condition is the value of the error estimate information being less than or equal to an error bit quantity threshold.

9. A memory controlling circuit unit for controlling a rewritable non-volatile memory module, wherein the rewritable non-volatile memory module comprises a plurality of memory cells, wherein the memory controlling circuit unit comprises:
a host interface, configured to couple to a host system;
a memory interface, configured to couple to the rewritable non-volatile memory module;
a memory management circuit, coupled to the host interface and the memory interface; and
an error checking and correcting circuit, coupled to the memory management circuit, and configured to perform a first type decoding operation for a first frame comprising a first codeword to obtain a second codeword,
wherein the memory management circuit is configured to record error estimate information corresponding to the first frame according to an execution result of the first type decoding operation,
wherein the memory management circuit is further configured to update the first codeword in the first frame to the second codeword if the error estimate information matches a first condition,
wherein the memory management circuit is further configured to not updating the first codeword in the first frame to the second codeword if the error estimate information does not match the first condition,
wherein the error checking and correcting circuit is further configured to perform a second type decoding operation for a block code comprising the first frame.

10. The memory controlling circuit unit of claim 9, wherein the memory management circuit is further configured to send a first read command sequence, wherein the first read command sequence is configured to read data from the memory cells,
the memory management circuit is further configured to obtain a plurality of frames corresponding to the data, wherein the frames comprise the first frame, and the first frame comprises the first codeword.

11. The memory controlling circuit unit of claim 10, wherein the block code comprises the frames corresponding to the data,
wherein one iteration decoding operation corresponding to the block code comprises respectively performing the first type decoding operation for each of the frames, and performing the second type decoding operation for each of the frames.

12. The memory controlling circuit unit of claim 11, wherein before performing the second type decoding operation for the block code comprising the first frame, the memory management circuit is further configured to determine whether at least one frame having the error estimate information of a codeword thereof matching the first condition exists among the frames,
wherein the memory management circuit is further configured to perform next iteration decoding operation corresponding to the block code after performing the second type decoding operation for the block code comprising the first frame if the at least one frame having the error estimate information of the codeword thereof matching the first condition exists among the frames,
wherein the memory management circuit is further configured to stop the iteration decoding operation corresponding to the block code if the at least one frame having the error estimate information of the codeword thereof matching the first condition does not exist among the frames.

13. The memory controlling circuit unit of claim 11, wherein the first type decoding operation comprises a low density parity code algorithm, and the second type decoding operation comprises a Reed-solomon code algorithm,
wherein the first type decoding operation is to respectively perform a horizontal decoding for all bits of each of the frames, and the second type decoding operation is to simultaneously perform a vertical decoding for each respective Nth bit of each of the frames.

14. The memory controlling circuit unit of claim 9, wherein in the operation of recording the error estimate information corresponding to the first frame according to the execution result of the first type decoding operation, the memory management circuit is further configured to obtain the error estimate information corresponding to the first codeword,
wherein the error estimate information is configured to indicate a size of a total number of error bits of the first codeword.

15. The memory controlling circuit unit of claim 14, wherein in the operation of obtaining the error estimate information corresponding to the first codeword,
the error checking and correcting circuit is further configured to perform a parity check operation for the first codeword to obtain a plurality of first syndromes, and the memory management circuit records a value of the error estimate information as a sum of the first syndromes.

16. The memory controlling circuit unit of claim 15, wherein the first condition is the value of the error estimate information being less than or equal to an error bit quantity threshold.

17. A memory storage device, comprising:
a connection interface unit, configured to couple to a host system;
a rewritable non-volatile memory module comprising a plurality of memory cells; and
a memory controlling circuit unit, coupled to the connection interface unit and the rewritable non-volatile memory module,
wherein the memory controlling circuit unit is configured to perform a first type decoding operation for a first frame comprising a first codeword to obtain a second codeword,
wherein the memory controlling circuit unit is configured to record error estimate information corresponding to the first frame according to an execution result of the first type decoding operation,
wherein the memory controlling circuit unit is further configured to update the first codeword in the first frame to the second codeword if the error estimate information matches a first condition,
wherein the memory controlling circuit unit is further configured to not updating the first codeword in the first frame to the second codeword if the error estimate information does not match the first condition,
wherein the memory controlling circuit unit is further configured to perform a second type decoding operation for a block code comprising the first frame.

18. The memory storage device of claim 17, wherein the memory controlling circuit unit is further configured to send a first read command sequence, wherein the first read command sequence is configured to read data from the memory cells,
the memory controlling circuit unit is further configured to obtain a plurality of frames corresponding to the data, wherein the frames comprise the first frame, and the first frame comprises the first codeword.

19. The memory storage device of claim 18, wherein the block code comprises the frames corresponding to the data,
wherein one iteration decoding operation corresponding to the block code comprises respectively performing the first type decoding operation for each of the frames, and performing the second type decoding operation for each of the frames.

20. The memory storage device of claim 19, wherein before performing the second type decoding operation for the block code comprising the first frame, the memory controlling circuit unit is further configured to determine whether at least one frame having the error estimate information of a codeword thereof matching the first condition exists among the frames,
wherein the memory controlling circuit unit is further configured to perform next iteration decoding operation corresponding to the block code after performing the second type decoding operation for the block code comprising the first frame if the at least one frame having the error estimate information of the codeword thereof matching the first condition exists among the frames,
wherein the memory controlling circuit unit is further configured to stop the iteration decoding operation corresponding to the block code if the at least one frame having the error estimate information of the codeword thereof matching the first condition does not exist among the frames.

21. The memory storage device of claim 19, wherein the first type decoding operation comprises a low density parity code algorithm, and the second type decoding operation comprises a Reed-solomon code algorithm,
wherein the first type decoding operation is to respectively perform a horizontal decoding for all bits of each of the frames, and the second type decoding operation is to simultaneously perform a vertical decoding for each respective Nth bit of each of the frames.

22. The memory storage device of claim 17, wherein in the operation of recording the error estimate information corresponding to the first frame according to the execution result of the first type decoding operation, the memory controlling circuit unit is further configured to obtain the error estimate information corresponding to the first codeword,
wherein the error estimate information is configured to indicate a size of a total number of error bits of the first codeword.

23. The memory storage device of claim 22, wherein in the operation of obtaining the error estimate information corresponding to the first codeword,
the memory controlling circuit unit is further configured to perform a parity check operation for the first codeword to obtain a plurality of first syndromes, and record a value of the error estimate information as a sum of the first syndromes.

24. The memory storage device of claim 23, wherein the first condition is the value of the error estimate information being less than or equal to an error bit quantity threshold.

* * * * *